United States Patent [19]
Fujimoto et al.

[11] 4,115,796
[45] Sep. 19, 1978

[54] COMPLEMENTARY-MOS INTEGRATED SEMICONDUCTOR DEVICE

[75] Inventors: Takeo Fujimoto, Toyonaka; Yasuo Torimaru, Nara; Shin-ichi Ogawa, Suita; Shinya Yasue, Matsubara, all of Japan

[73] Assignee: Sharp Kabushiki Kaisha, Osaka, Japan

[21] Appl. No.: 784,715

[22] Filed: Apr. 5, 1977

Related U.S. Application Data

[63] Continuation of Ser. No. 592,936, Jul. 3, 1975, abandoned.

[30] Foreign Application Priority Data

Jul. 5, 1974 [JP] Japan .................. 49-81920

[51] Int. Cl.² ............................................ H01L 27/04
[52] U.S. Cl. ...................................... 357/42; 307/303; 307/304; 307/313
[58] Field of Search ........................... 357/42, 41, 91; 307/279, 303, 304, 313

[56] References Cited

U.S. PATENT DOCUMENTS

| | | | |
|---|---|---|---|
| 3,851,189 | 11/1974 | Moyer | 307/279 |
| 3,868,274 | 2/1975 | Hubar et al. | 357/41 |
| 3,919,430 | 10/1975 | Heuner et al. | 357/42 |
| 3,958,187 | 5/1976 | Suzuki et al. | 307/303 |

OTHER PUBLICATIONS

Swanson et al., "Ion-Implanted Complementary MOS Transistors in Low-Voltage Circuits", IEEE Journal of Solid State Circuits, vol. 7, No. 2, Apr. 1972, pp. 146-152.

*Primary Examiner*—Stanley D. Miller, Jr.
*Assistant Examiner*—James W. Davie
*Attorney, Agent, or Firm*—Birch, Stewart, Kolasch and Birch

[57] ABSTRACT

Formation of well-regions of a conductivity type opposite to that of a substrate is achieved in such a manner to determine a first threshold voltage level. Ion implantation is effected on desirably selected gates in the respective channels formed on the substrate and the well-regions. Two channels on the ion implanted substrate and on the well-region in which the ion implantation is not effected, are coupled to form a complementary-MOS transistor pair having a first threshold voltage level. The channels on the substrate in which the ion implantation is not effected and on the ion implanted well-region are coupled to form another complementary-MOS transistor pair having a second threshold voltage level.

2 Claims, 2 Drawing Figures

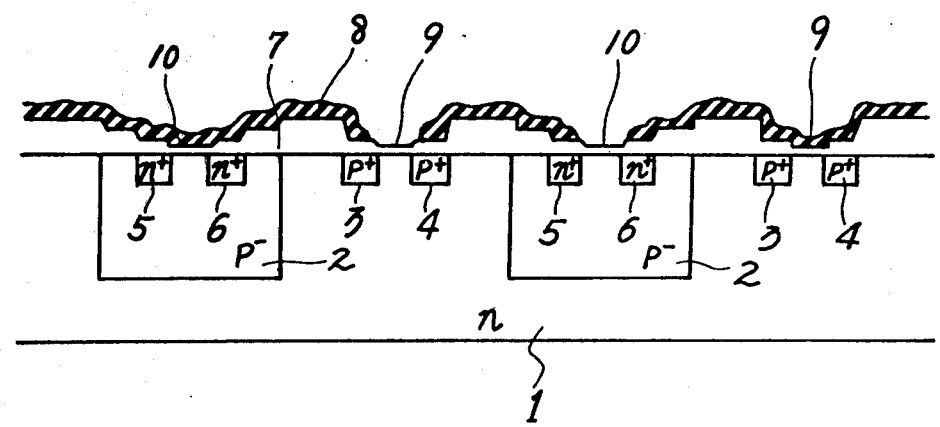

COMPLEMENTARY-MOS INTEGRATED SEMICONDUCTOR DEVICE

This is a continuation of application Ser. No. 592,936 filed July 3, 1975, now abandoned.

BACKGROUND OF THE INVENTION

The present invention relates to a complementary-MOS integrated semiconductor device provided on a single substrate, and more particularly to a complementary-MOS integrated semiconductor device having two different threshold voltage levels.

The complementary-MOS IC and the complementary-MOS LSI have, in general, great advantages in their high switching velocity and their extremely small power dissipation. In the C-MOS IC or C-MOS LSI of the prior art, every channel was constructed to have the same threshold voltage level. When the C-MOS IC or C-MOS LSI were utilized in for an electronic wristwatch or an electronic calculator driven by a low voltage power source such as a cell, the respective channels were so constructed to have a relatively low threshold voltage level.

It was required to include a drive circuit for a display system comprising, for example, light-emitting diodes or a crystal display unit, within a single C-MOS IC or C-MOS LSI. The light-emitting diodes and the liquid crystal display unit are usually driven by a relatively high voltage. When the high voltage is applied to the C-MOS IC or C-MOS LSI having the relatively low threshold voltage level, the elements may be ruptured or the elements consume large amounts of power.

OBJECTS AND SUMMARY OF THE INVENTION

Accordingly, an object of the present invention is to provide a complementary-MOS integrated semiconductor device including the C-MOS transistors having two different threshold voltage levels.

Another object of the present invention is to provide a complementary-MOS integrated semiconductor device suitable for use in an electronic wristwatch or an electronic calculator which comprise a computation or logic circuit driven by a low voltage source and a display system driven by a high voltage source.

Still another object of the present invention is to provide a fabrication method of a C-MOS IC or C-MOS LSI including C-MOS transistors having two different threshold voltage levels on a single substrate.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objectives, pursuant to the present invention, well-regions are provided on a substrate to determine a first threshold voltage level. Ion implantation is effected on desirably selected gates in the respective channels formed on the substrate and the well-regions.

Two channels on the ion implanted substrate and on the well-region in which the ion implantation is not effected are coupled to form a complementary-MOS transistor pair having a first threshold voltage level. The other two channels on the substrate in which the ion implantation is not effected and on the ion implanted well-region are coupled to form another complementary-MOS transistor pair having a second threshold voltage level.

BRIEF DESCRIPTION OF THE DRAWING

The present invention will become more fully understood from the detailed description given hereinbelow and the accompanying drawing which is given by way of illustration only, and thus is not limitative of the present invention and wherein, The single drawing is a sectional view for the purpose of explanation of an embodiment of the present invention.

DESCRIPTION OF THE PREFERRED EMBODIMENTS

Referring now to the drawing, there is illustrated an embodiment of a complementary-MOS integrated semiconductor device of the present invention. In the course of the fabrication steps thereof, P-type well-regions 2 are formed in an N-type substrate 1. The P-type well-regions 2 are formed through the use of conventional diffusion techniques or ion implantation techniques with suitable source material such as boron nitride. The donor concentration is reduced near the surface of the well-regions 2 upon which the boron nitride diffusion or ion implantation is effected in such a manner to provide a low threshold voltage level VTL.

P-channel source regions 3 and P-channel drain regions 4 are formed in the N-type substrate 1, whereas N-channel source regions 5 and N-channel drain regions 6 are formed in the P-type well-regions 2 through the use of conventional techniques. A photoresist layer 8 is provided on a protective insulating layer 7 made of, for example, silicon dioxide. The photoresist layer 8 is selectively removed at desired positions corresponding to selected P-channel gates 9 and selected N-channel gates 10 through the use of a suitable mask as is well known in the art.

Ion implantation of boron is effected into the P-channel gates 9 on which the photoresist layer 8 is removed and the N-channel gates 10 on which the photoresist layer 8 is also removed. The donor concentration is reduced near the surface of the N-type substrate 1 under the P-channel gate 9 on which the ion implantation is effected. In this way, a P-channel MOS transistor having the low threshold voltage level VTL is formed, the level VTL being determined at the time when the P-type well-regions 2 are formed. The ion implantation is not effected into the N-channel gate 10 on which the photoresist layer 8 is not removed and, therefore, an N-channel MOS transistor having the low threshold voltage level VTL is formed. These two MOS transistors shown in the left side of the drawing are coupled to form a C-MOS transistor pair having the low threshold voltage level VTL.

The acceptor concentration is increased near the surface of the P-type well-regions 2 under the N-channel gate 10 on which the ion implantation is effected and, therefore, an N-channel MOS transistor having a high threshold voltage level VTH is formed. The high threshold voltage level VTH is so determined that a P-channel MOS transistor including a P-channel gate 9 on which the photoresist layer 8 is not removed and, therefore, the ion implantation is not effected therein and has the same threshold voltage level VTH. These two MOS transistors shown in the right side of the drawing are coupled to form another C-MOS transistor pair having the high threshold voltage level VTH.

It will be clear that the C-MOS transistors of the present invention can be formed on a P-type substrate in a same manner as described above. Moreover, the channel number can be desirably selected.

As described in detail, a complementary-MOS integrated semiconductor device including the C-MOS transistors having two different threshold voltage levels can be fabricated on a single substrate in a simple way. Since the respective transistors of each of the C-MOS transistor pairs are so constructed to have the same threshold voltage level, the power dissipation can be minimized and the circuit will become reliable. The semiconductor device of the present invention can be effectively applied to electronic wristwatches and electronic calculators wherein two different voltage sources are provided for driving the logic circuit and the display system, respectively.

The invention being thus described, it will be obvious that the same may be varied in many ways. Such variations are not to be regarded as a departure from the spirit and scope of the invention, and all such modifications are intended to be included within the scope of the following claims.

What is claimed is:

1. In a complementary integrated semiconductor device including a substrate of a first conductivity type, well-regions of a second conductivity type, a first pair of channels of the second conductivity type formed on the substrate, and a second pair of channels of the first conductivity type formed on the well-regions, the improvement comprising:

ion implanted gate regions in a selected one of said first pair of channels formed on the substrate and in a selected one of said second pair of channels formed on said well-regions, the ion implanted gate region in said first pair of channels having a first threshold level and the ion implanted gate region in said second pair of channels having a second threshold level different from said first threshold level;

non-ion implanted gate regions in the remaining channels of said pairs formed on the substrate and well-regions, the non-ion implanted gate region in said first pair of channels having said second threshold level and the non-ion implanted gate region in said second pair of channels having said first threshold level;

a first pair of complementary MOS transistors including the channel on the substrate in which the gate region is ion implanted and the channel on the well-region in which the gate region is not ion implanted; and a second pair of complementary MOS transistors including the channel on the substrate in which the gate region is not ion implanted and the channel on the well-region in which the gate is ion implanted.

2. The complementary-MOS integrated semiconductor device of claim 1 wherein the first threshold voltage level is lower than the second threshold voltage level.

* * * * *